US012802948B2

(12) United States Patent
Elumalai et al.

(10) Patent No.: US 12,802,948 B2
(45) Date of Patent: Nov. 17, 2026

(54) ELECTROSTATIC CHUCK WITH HIGH COOLING EFFICIENCY

(71) Applicant: Applied Materials, Inc., Santa Clara, CA (US)

(72) Inventors: Karthik Elumalai, Singapore (SG); Ananthkrishna Jupudi, Singapore (SG); Arunkumar Tatti, Bangalore (IN); Cheng Sun, Singapore (SG); Ye Liu, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 511 days.

(21) Appl. No.: 18/231,655

(22) Filed: Aug. 8, 2023

(65) Prior Publication Data

US 2025/0054737 A1 Feb. 13, 2025

(51) Int. Cl.
*H01J 37/32* (2006.01)

(52) U.S. Cl.
CPC .............................. *H01J 37/32724* (2013.01)

(58) Field of Classification Search
CPC ................................................ H01J 37/32724
See application file for complete search history.

(56) References Cited

U.S. PATENT DOCUMENTS 5,548,470 A 8/1996 Husain et al.
10,510,575 B2 12/2019 Kraus et al.
2004/0218339 A1* 11/2004 Nakamura .......... H10P 72/0434 361/234
2008/0037194 A1* 2/2008 Kamitani ................ H10P 72/72 361/234
2009/0284894 A1 11/2009 Cooke
2010/0039747 A1 2/2010 Sansoni et al.
2016/0148828 A1 5/2016 Parkhe
2017/0352568 A1 12/2017 Cho et al.
2019/0188492 A1 6/2019 Parthe
2020/0373184 A1* 11/2020 Prouty .................... H10P 72/72
2020/0411354 A1 12/2020 Rao et al.
2021/0104384 A1 4/2021 Parkhe
2022/0005723 A1 1/2022 Panavalappil Kumarankutty et al.

OTHER PUBLICATIONS

International Search Report for PCT/US2024/040386, dated Nov. 12, 2024.

* cited by examiner

*Primary Examiner* — Yuechuan Yu
(74) *Attorney, Agent, or Firm* — Moser Taboada

(57) ABSTRACT

Embodiments of substrate supports having electrostatic chucks (ESCs) for use in substrate process chambers are provided herein. In some embodiments, a substrate support includes: an electrostatic chuck (ESC) having a top surface and a plurality of mesas extending upward from the top surface, wherein an upper surface of the plurality of mesas define a substrate support surface, wherein a total surface area of the substrate support surface is about 18 to about 40 percent a total surface area of the upper surface, and wherein the ESC includes a plurality of backside gas openings extending through the ESC; and one or more chucking electrodes disposed in the ESC.

20 Claims, 11 Drawing Sheets

ELECTROSTATIC CHUCK WITH HIGH COOLING EFFICIENCY

FIELD

Embodiments of the present disclosure generally relate to substrate processing equipment.

BACKGROUND

In the processing of substrates, such as semiconductor substrates and displays, the substrate is held on a substrate support surface in a processing chamber during processing. The substrate support surface may include an electrostatic chuck (ESC) having one or more electrodes that can be electrically biased to hold a substrate to the substrate support surface. An upper surface of the ESC may have protrusions, or mesas, which form the substrate support surface. The mesas separate the back side of the substrate from the upper surface of the ESC so that backside cooling gas may be delivered to the substrate. However, substrate mesas that are too sparse may lead to overheating of a substrate.

Accordingly, the inventors have provided herein embodiments of improved ESCs.

SUMMARY

Embodiments of substrate supports having electrostatic chucks (ESCs) for use in substrate process chambers are provided herein. In some embodiments, a substrate support includes: an electrostatic chuck (ESC) having a top surface and a plurality of mesas extending upward from the top surface, wherein an upper surface of the plurality of mesas define a substrate support surface, wherein a total surface area of the substrate support surface is about 18 to about 40 percent a total surface area of the upper surface, and wherein the ESC includes a plurality of backside gas openings extending through the ESC; and one or more chucking electrodes disposed in the ESC.

In some embodiments, a substrate support includes: an electrostatic chuck (ESC) having a top surface and a plurality of mesas extending upward from the top surface, wherein an upper surface of the plurality of mesas define a substrate support surface, wherein a total surface area of the substrate support surface is 18 percent to about 40 percent of a total surface area of the upper surface, wherein the ESC includes a plurality of lift pin openings, and wherein the ESC includes a plurality of backside gas openings extending through the ESC and terminating on the top surface; and one or more chucking electrodes disposed in the ESC.

In some embodiments, a process chamber includes: a chamber body defining an interior volume therein; and a substrate support disposed in the interior volume, the substrate support comprising: an electrostatic chuck (ESC) having a top surface and a plurality of mesas extending upward from the top surface, wherein an upper surface of the plurality of mesas define a substrate support surface, wherein a total surface area of the substrate support surface is 18 percent to about 40 percent of a total surface area of the upper surface, and wherein the ESC includes a plurality of backside gas openings extending through the ESC; and one or more chucking electrodes disposed in the ESC.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
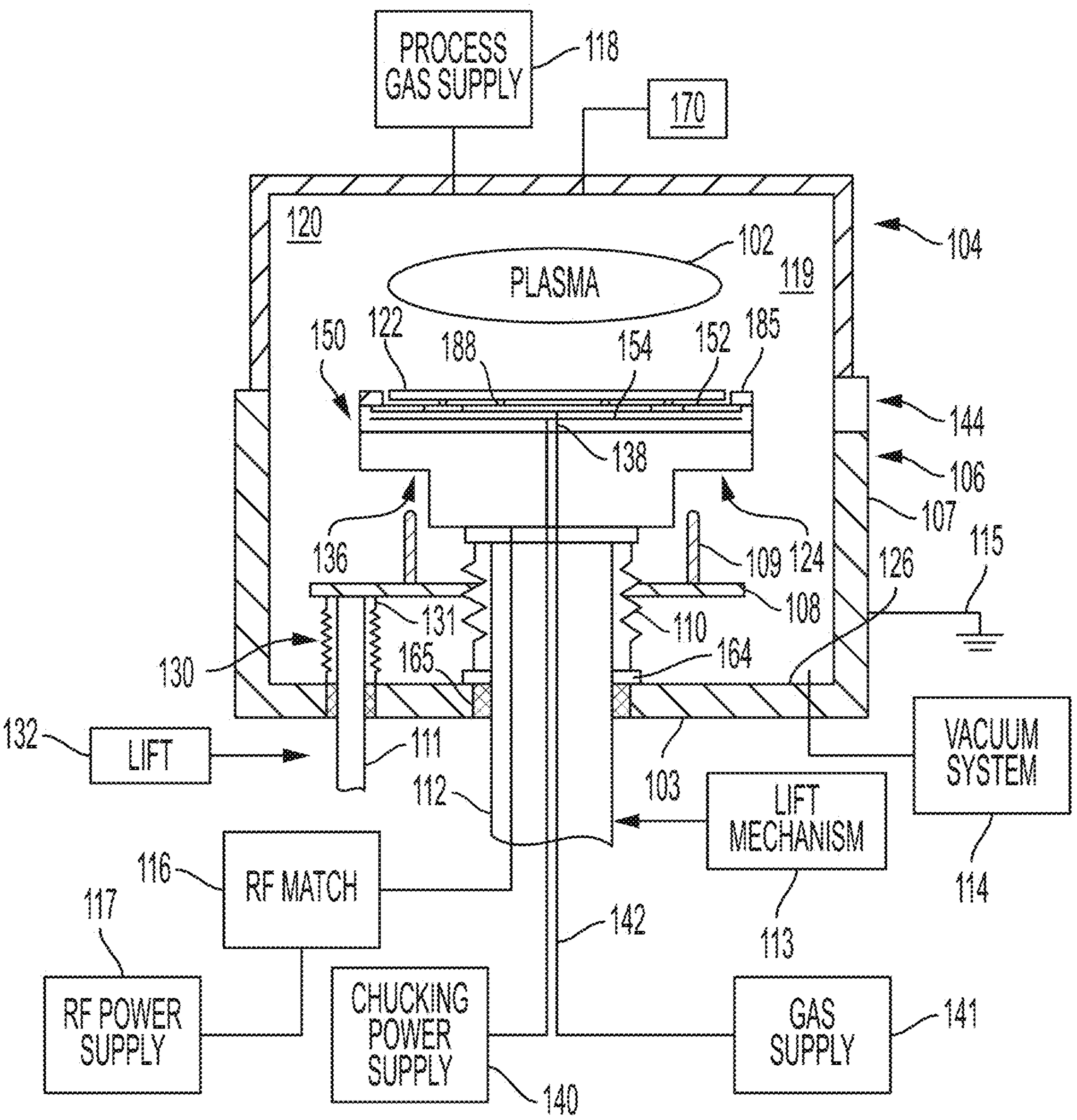
FIG. 1 depicts a schematic side view of a process chamber in accordance with at least some embodiments of the present disclosure.

To facilitate understanding, identical reference numerals have been used, where possible, to designate identical elements that are common to the FIGURES. The FIGURES are not drawn to scale and may be simplified for clarity. Elements and features of one embodiment may be beneficially incorporated in other embodiments without further recitation.

DETAILED DESCRIPTION

Embodiments of substrates supports comprising electrostatic chucks having mesas on an upper surface thereof are provided herein. The mesas advantageously increase cooling of a substrate, such as a glass substrate, and prevent overheating of the substrate. The mesas are configured to provide an increased contact area with the substrate compared with conventional substrate support to increase cooling of the substrate and prevent overheating of the substrate.

FIG. 1 depicts a schematic cross-sectional side view of a process chamber having an electrostatic chuck in accordance with at least some embodiments of the present disclosure. In some embodiments, the process chamber 100 is an etch process chamber configured for performing a backside via reveal process. In other embodiments, the process chamber 100 may be a deposition chamber, or any other suitable chamber for substrate processing that includes backside gas flow. The process chamber 100 may generally be a vacuum chamber that is suitably adapted to maintain sub-atmospheric pressures within an interior volume 120 during substrate processing. The process chamber 100 includes a chamber body 106 having a bottom plate 103, a lid 104, and sidewalls 107 extending from the bottom plate 103 to the lid 104. The chamber body 106 is made of a suitable material, for example, aluminum.

A substrate support 124 is disposed within the interior volume 120 to support and retain a substrate 122, such as a glass substrate, a semiconductor wafer, or other such substrate as may be retained. The substrate support 124 may generally comprise a pedestal 150 coupled to a hollow shaft 112. The pedestal 150 comprises an electrostatic chuck (ESC) 152 disposed on a base assembly 136 having a cooling plate 260 (see FIG. 2). In some embodiments, the substrate support 124 may include an edge ring 185 disposed on the ESC 152. The ESC 152 may include one or more chucking electrodes 154 configured to electrostatically chuck the substrate 122 to the ESC 152. The one or more chucking electrodes 154 may also electrostatically chuck the edge ring 185 to the ESC 152. In some embodiments, the ESC 152 is made of a ceramic material, for example aluminum oxide ($Al_2O_3$).

The hollow shaft 112 provides a conduit to provide, for example, backside gases, process gases, fluids, coolants, power, or the like, to the pedestal 150. In some embodiments, the hollow shaft 112 is coupled to a lift mechanism 113, such as an actuator or motor, which provides vertical movement of the pedestal 150 between an upper, processing position and a lower, transfer position. A bellows assembly 110 is disposed about the hollow shaft 112 and is coupled between the pedestal 150 and a bottom surface 126 of the process chamber 100 to provide a flexible seal that allows vertical motion of the pedestal 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

The process chamber 100 is coupled to and in fluid communication with a process gas supply 118 which may supply one or more process gases to the process chamber 100 for processing the substrate 122. The interior volume 120 may include a processing volume 119 located in the upper half of the interior volume 120 and generally between the substrate support 124 and the lid 104. The process chamber 100 may also include one or more shields (not shown) circumscribing various chamber components to prevent unwanted reaction between such components and ionized process material. The chamber body 106 may be made of metal, such as aluminum. The chamber body 106 may be grounded via a coupling to ground 115.

In some embodiments, the hollow shaft 112 facilitates coupling a backside gas supply 141, a chucking power supply 140, and RF power sources (e.g., a bias power supply 117) to the pedestal 150. In some embodiments, the bias power supply 117 includes one or more RF bias power sources. In some embodiments, an RF plasma power supply 170 is coupled to the lid 104. In some embodiments, RF energy supplied by the RF plasma power supply 170 may have a frequency of about 400 kHz to over 40 MHz. A plasma 102 may be formed in the interior volume via inductively coupled energy. For example, in some embodiments, the RF plasma power supply 170 is coupled to an antenna assembly or electrode to couple RF energy to a plasma 102 in the interior volume 120. The backside gas supply 141 is disposed outside of the chamber body 106 and supplies heat transfer gas to the pedestal 150. In some embodiments, a bias power supply 117 and the RF plasma power supply 170 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The process chamber 100 may include a second lift 130. The second lift 130 can include a plurality of lift pins 109 mounted on a platform 108 connected to a shaft 111 which is coupled to a second lift mechanism 132 for raising and lowering the second lift 130. The plurality of lift pins 109 may extend through the ESC 152 so that the substrate 122 may be placed on or removed from the pedestal 150. In some embodiments, each of the lift pins 109 are not mounted to a common platform and are independently controllable. The pedestal 150 may include through holes to receive one or more of the lift pins 109. A bellows assembly 131 is coupled between the second lift 130 and bottom surface 126 to provide a flexible seal which maintains the chamber vacuum during vertical motion of the second lift 130. In some embodiments, as shown in FIG. 1, the second lift 130 is disposed outside of the hollow shaft 112.

The pedestal 150 includes gas distribution channels 138 extending, for example, from a lower surface of the pedestal 150 (e.g., bottom surface of the base assembly 136) to various openings in an upper surface of the pedestal 150. The gas distribution channels 138 are configured to provide backside gas, such as nitrogen (N) or helium (He), to the upper surface of the pedestal 150 to act as a heat transfer medium. The gas distribution channels 138 are in fluid communication with the backside gas supply 141 via gas conduit 142 to control the temperature and/or temperature profile of the pedestal 150 during use. The ESC 152 includes a plurality of mesas 188 extending from a top surface of the ESC 152 configured to elevate the substrate 122 slightly above the upper surface to control heat transfer between the ESC 152 and the substrate 122 and disperse the backside gas in a more uniform manner. In some embodiments, the gas distribution channels 138 are configured to provide gas pressure for heat transfer and temperature control of the edge ring 185 independently from a temperature of the ESC 152. In some embodiments, the gas distribution channels 138 extend through the ESC 152 along two or more rings (see FIG. 3).

The process chamber 100 is coupled to and in fluid communication with a vacuum system 114 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 includes a slit valve 144 having a substrate transfer opening that is selectively opened or closed to facilitate transferring the substrate 122 into and out of the interior volume 120. In some embodiments, a transfer robot (not shown) having one or more transfer blades is configured to transfer the substrate 122.

In operation, for example, a plasma 102 may be created in the interior volume 120 to perform one or more processes. The plasma 102 may be created by coupling power from a plasma power source (e.g., RF plasma power supply 170) to a process gas via one or more electrodes near or within the interior volume 120 to ignite the process gas and creating the plasma 102. A bias power may be provided from a bias power supply (e.g., bias power supply 117) to the pedestal 150 to attract ions from the plasma 102 towards the substrate 122. The bias power supply 117 may supply bias power to the edge ring 185 and the ESC 152. For example, the bias power supply 117 may comprise a single power supply that is shared by both the edge ring 185 and the ESC 152. Backside gas, or heat transfer gas, may be provided to the substrate 122 via gas conduit 142 to control the temperature and/or temperature profile of the pedestal 150 during use.

Figure 2:
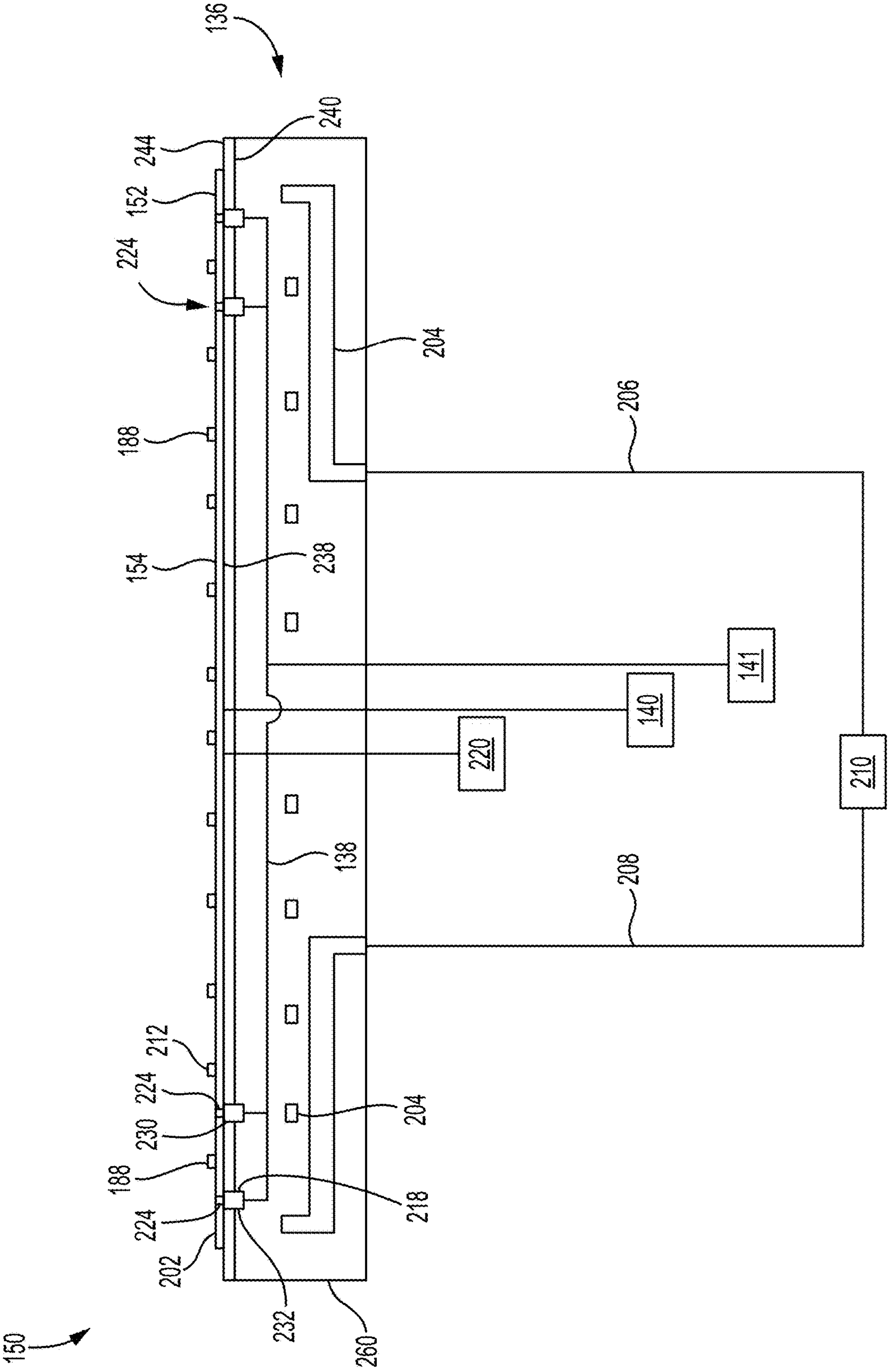
FIG. 2 depicts a schematic section side view of a pedestal in accordance with at least some embodiments of the present disclosure.

FIG. 2 depicts a schematic section side view of a pedestal 150 in accordance with at least some embodiments of the present disclosure. The pedestal 150 generally comprises the base assembly 136 coupled to the ESC 152. In some embodiments, the base assembly 136 includes one or more cooling channels 204 disposed therein. The one or more cooling channels 204 may be coupled to a chiller 210 configured to facilitate recirculation and regulate a temperature of cooling liquid through the one or more cooling channels 204. For example, the chiller 210 may supply cooling liquid to the one or more cooling channels 204 via a first line 206. Cooling liquid from the one or more cooling channels 204 may return to the chiller 210 via a second line 208 to get chilled to a regulated temperature.

The ESC 152 includes a top surface 202 and the plurality of mesas 188 extend upward from the top surface 202. An upper surface 212 of the plurality of mesas 188 define a substrate support surface. In some embodiments, the ESC 152 includes an upper peripheral notch 244 disposed about the top surface 202, to support, for example, the edge ring 185. In some embodiments, the gas distribution channels 138 extend through the base assembly 136 and the ESC 152. The gas distribution channels 138 comprise a plurality of backside gas openings 224 extending through the ESC 152 that are fluidly coupled to the backside gas supply 141.

In some embodiments, a porous plug 230 is disposed in each of the plurality of backside gas openings 224 at an interface between the ESC 152 and the base assembly 136. In some embodiments, a porous plug 232 is disposed in each gas opening 218 of the base assembly 136 opposite each of the plurality of backside gas openings 224. The porous plug 230 and the porous plug 232 are made of a suitable material for providing protection against plasma formation and arcing while providing an adequate flow path for backside gases.

In some embodiments, one or more heating elements 238 are disposed in the ESC 152. The one or more heating elements 238 may comprise any suitable element such as resistive heating elements. In some embodiments, the one or more heating elements 238 are disposed between the one or more chucking electrodes 154 and a bottom surface 240 of the ESC 152. The one or more heating elements 238 may be arranged along one or more separate heating zones. A heater power source 220 may be coupled the one or more heating elements 238 to provide power. In some embodiments, where there is more than one heating zone, the heater power source 220 may be coupled to separate heater terminals coupled to the bottom surface 240, such as two terminals for each heater zone (see FIG. 9).

Figure 3:
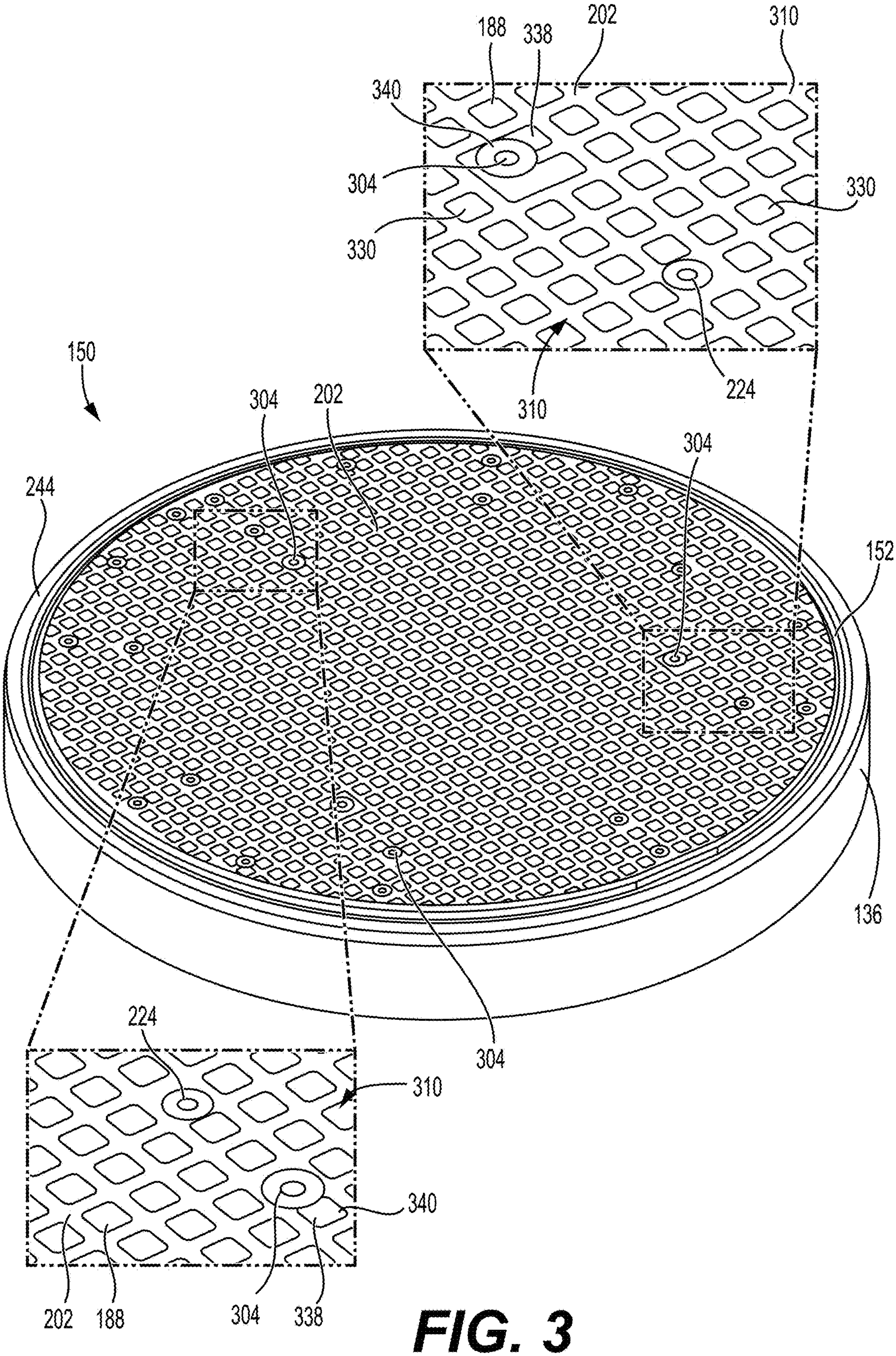
FIG. 3 depicts a schematic isometric top view of a pedestal in accordance with at least some embodiments of the present disclosure.
Figure 4:
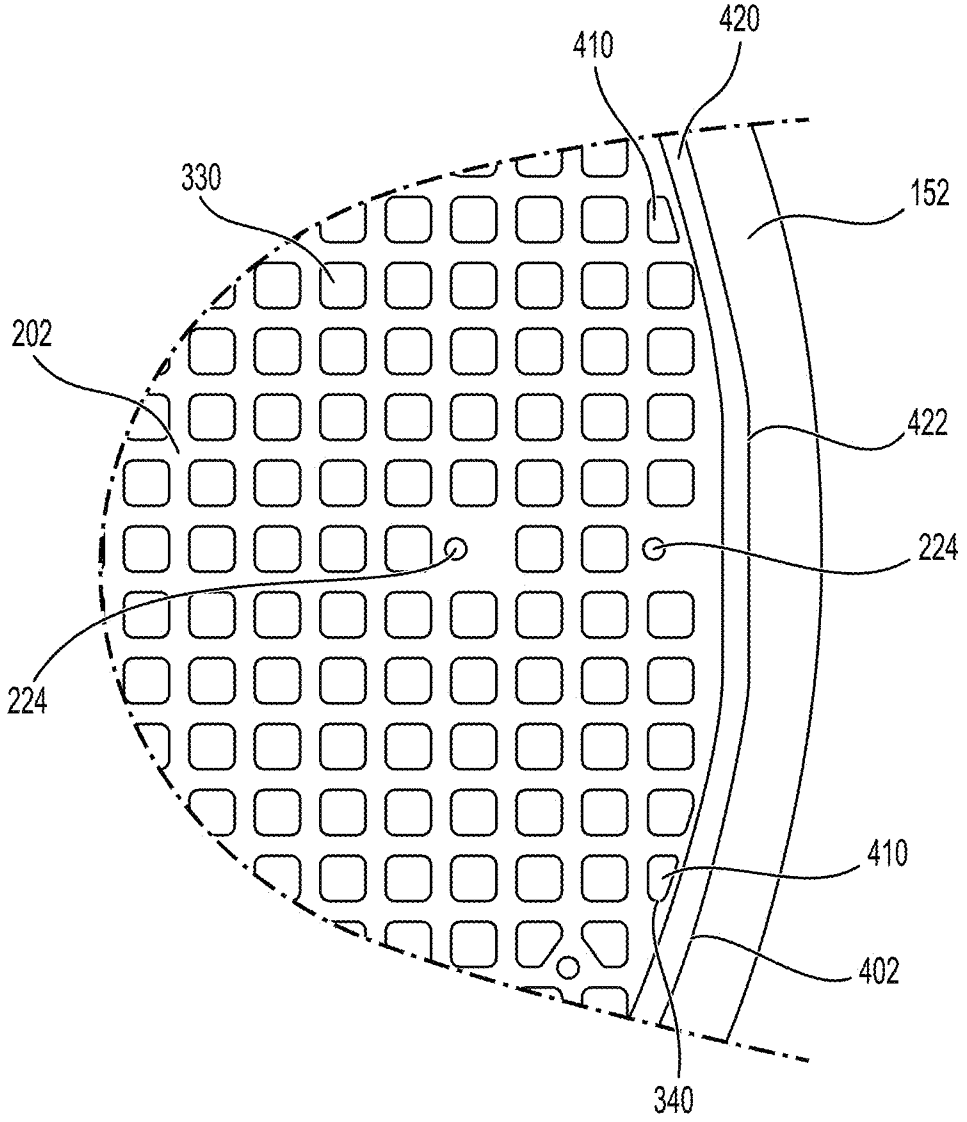
FIG. 4 depicts a top view of a portion of a pedestal in accordance with at least some embodiments of the present disclosure.

FIG. 3 depicts a schematic isometric top view of a pedestal 150 in accordance with at least some embodiments of the present disclosure. FIG. 4 depicts a top view of a portion of a pedestal 150 in accordance with at least some embodiments of the present disclosure. In some embodiments, a plurality of lift pin openings 304 are disposed in the ESC 152 to accommodate corresponding ones of the plurality of lift pins 109.

In some embodiments, a total surface area of the substrate support surface defined by the plurality of mesas 188 (i.e., area defined by summation of the upper surface 212 of all mesas of the plurality of mesas 188) is advantageously 18 percent or more of a total surface area of the top surface 202 to provide sufficient contact area to cool the substrate 122. In some embodiments, the total surface area of the substrate support surface is 18 to 40 percent of the total surface area of the upper surface. Such a total surface area advantageously promotes cooling of the substrate 122 via enhanced contact area between the plurality of mesas 188 and the substrate 122 while maintaining adequate spacing on the non-contact areas 310 between adjacent mesas to provide sufficient spread of backside gases throughout the top surface 202. In some embodiments, the plurality of mesas 188 are substantially arranged in an orthogonal grid.

In some embodiments, the plurality of mesas 188 include a plurality of first mesas 330 and a plurality of second mesas 340. The plurality of first mesas 330 are substantially rectangularly shaped and the plurality of second mesas 340 are not rectangularly shaped. In some embodiments, the plurality of first mesas 330 are substantially square shaped and the plurality of second mesas 340 are not square shaped. In some embodiments, the plurality of first mesas are about 0.1 inches to about 0.25 inches wide by about 0.1 inches to about 0.25 inches long.

In some embodiments, the plurality of second mesas 340 comprise a plurality of edges mesas 410 and a plurality of lift pin mesas 338. In some embodiments, substantially all mesas of the plurality of mesas 188 comprise the plurality of first mesas 330. For example, all of the mesas of the plurality of mesas 188 comprise the plurality of first mesas 330 except for some mesas disposed about an outer periphery of the top surface 202 and mesas corresponding to locations of the openings for the plurality of lift pins 109 or the plurality of backside gas openings 224. In some embodiments, the plurality of first mesas 330 are substantially the same in shape and size.

The plurality of lift pin mesas 338 generally correspond with locations of the plurality of lift pin openings 304, for example, proximate the plurality of lift pin openings 304. In some embodiments, a first lift pin of the plurality of lift pin openings 304 extends through a first mesa of the plurality of lift pin mesas 338. In some embodiments, each lift pin opening of the plurality of lift pin openings 304 extends through one of the lift pin mesas of the plurality of lift pin mesas 338. In some embodiments, the plurality of lift pin mesas 338 are larger in size than the plurality of first mesas 330 and the plurality of edge mesas 410. In some embodiments, at least one of the plurality of lift pin mesas 338 includes a rounded portion. In some embodiments, the plurality of lift pin mesas 338 have different shapes and sizes.

As shown in FIG. 4, the plurality of edge mesas 410 are disposed proximate an outer edge 402 of the top surface 202 to account for a curvature of the outer edge 402. In some embodiments, the plurality of edge mesas 410 are non-rectangular quadrilaterals. In some embodiments, the outer edge 402 is generally circular but with a linear portion 422 to facilitate alignment during transfer of the substrate 122, for example, so that a transfer robot does not interfere with the plurality of lift pins 109.

In some embodiments, the top surface 202 includes a seal ring 420 disposed about the plurality of mesas 188. The seal ring 420 is raised from the top surface 202 at substantially the same height as the plurality of mesas 188 to support an edge of the substrate 122 and to substantially seal the backside gas therein when the substrate 122 is disposed on the pedestal 150.

Figure 5:
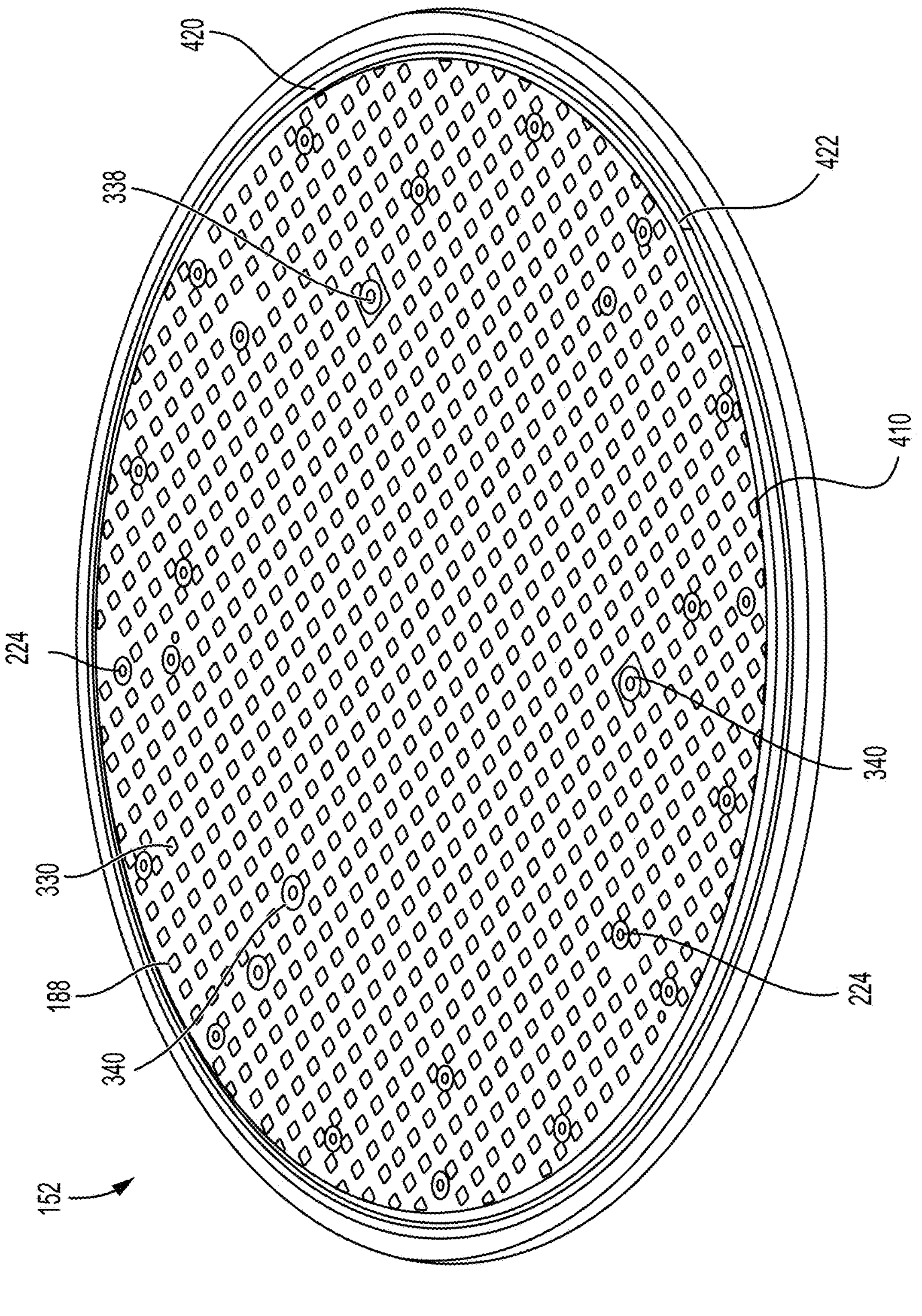
FIG. 5 depicts an isometric top view of an electrostatic chuck in accordance with at least some embodiments of the present disclosure.
Figure 6:
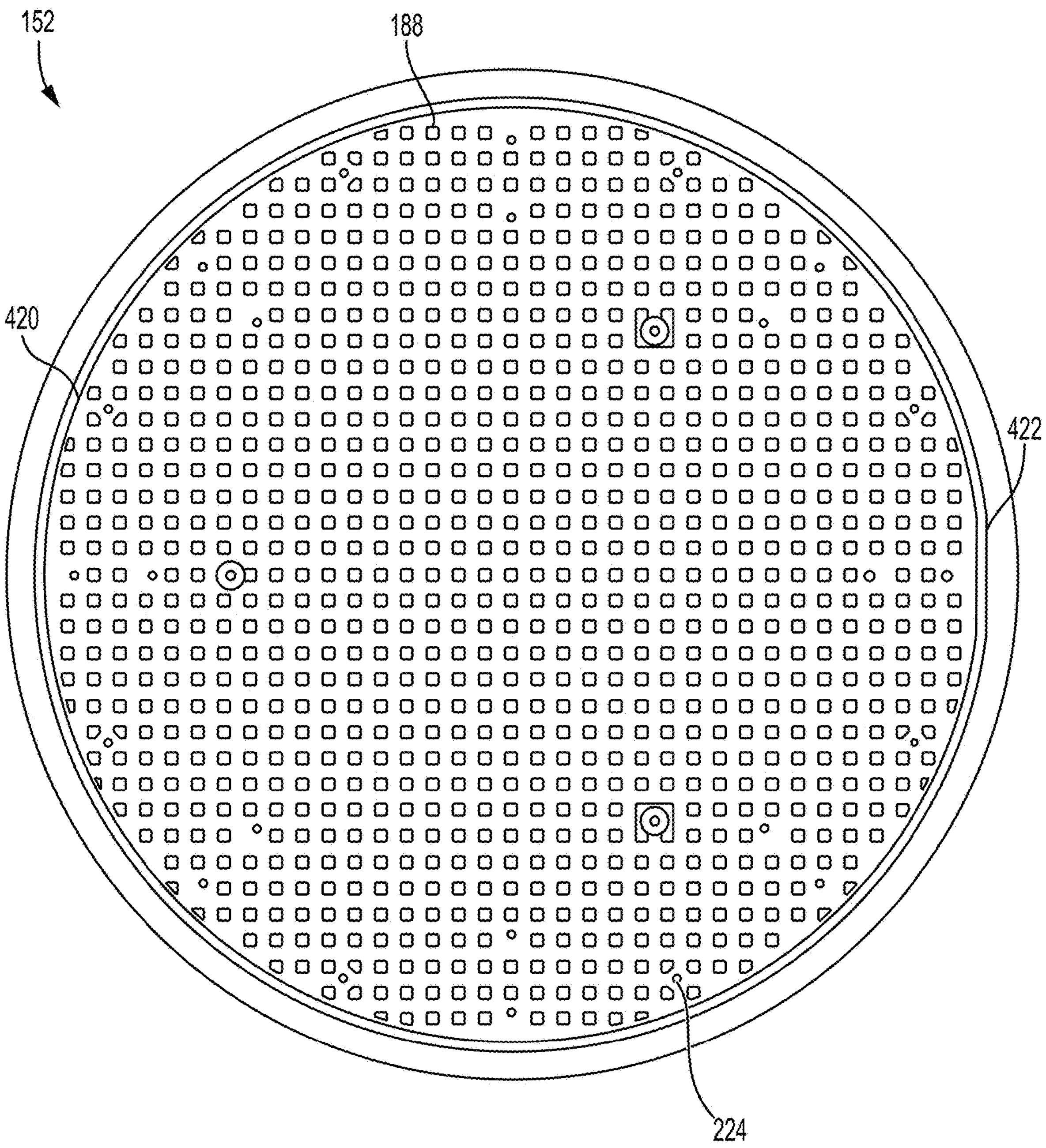
FIG. 6 depicts a top plan view of the electrostatic chuck of FIG. 5 in accordance with at least some embodiments of the present disclosure.

FIG. 5 depicts an isometric top view of an ESC 152 in accordance with at least some embodiments of the present disclosure. FIG. 6 depicts a top plan view of the ESC 152 of FIG. 5 in accordance with at least some embodiments of the present disclosure. In some embodiments, a total surface area of the substrate support surface defined by the plurality of mesas 188 is about 18 percent to about 23 percent of a total surface area of the top surface 202. In some embodiments, the plurality of first mesas 330 are about 0.11 inches to about 0.15 inches wide by about 0.11 inches to about 0.15 inches long.

In some embodiments, the plurality of backside gas openings 224 are disposed in the ESC 152 along one or more annular rings and terminate at the top surface 202 of the ESC 152. For example, as depicted in FIG. 5, the one or more annular rings consist of two rings. In some embodiments, the plurality of lift pin openings 304 are disposed radially inward of the plurality of backside gas openings 224. In some embodiments, a line extending from the linear portion 422 of the outer edge 402 to a farthest one of the plurality of lift pin openings 304 extends roughly halfway between two other lift pin openings of the plurality of lift pin openings 304. In some embodiments, all of the plurality of backside gas openings 224 terminate at the top surface 202 between adjacent mesas and not through any mesas of the plurality of mesas 188.

Figure 7:
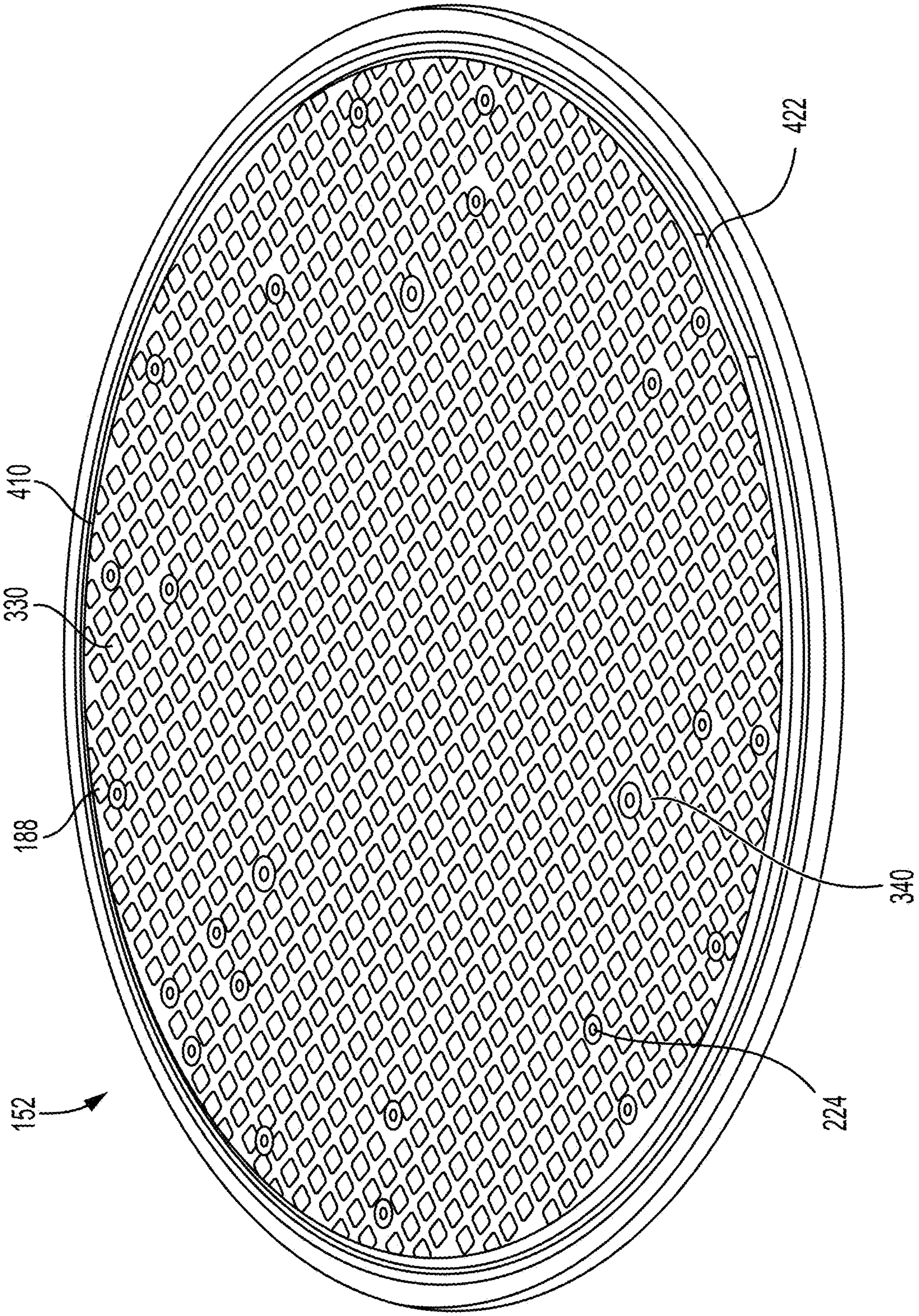
FIG. 7 depicts an isometric top view of an electrostatic chuck in accordance with at least some embodiments of the present disclosure.
Figure 8:
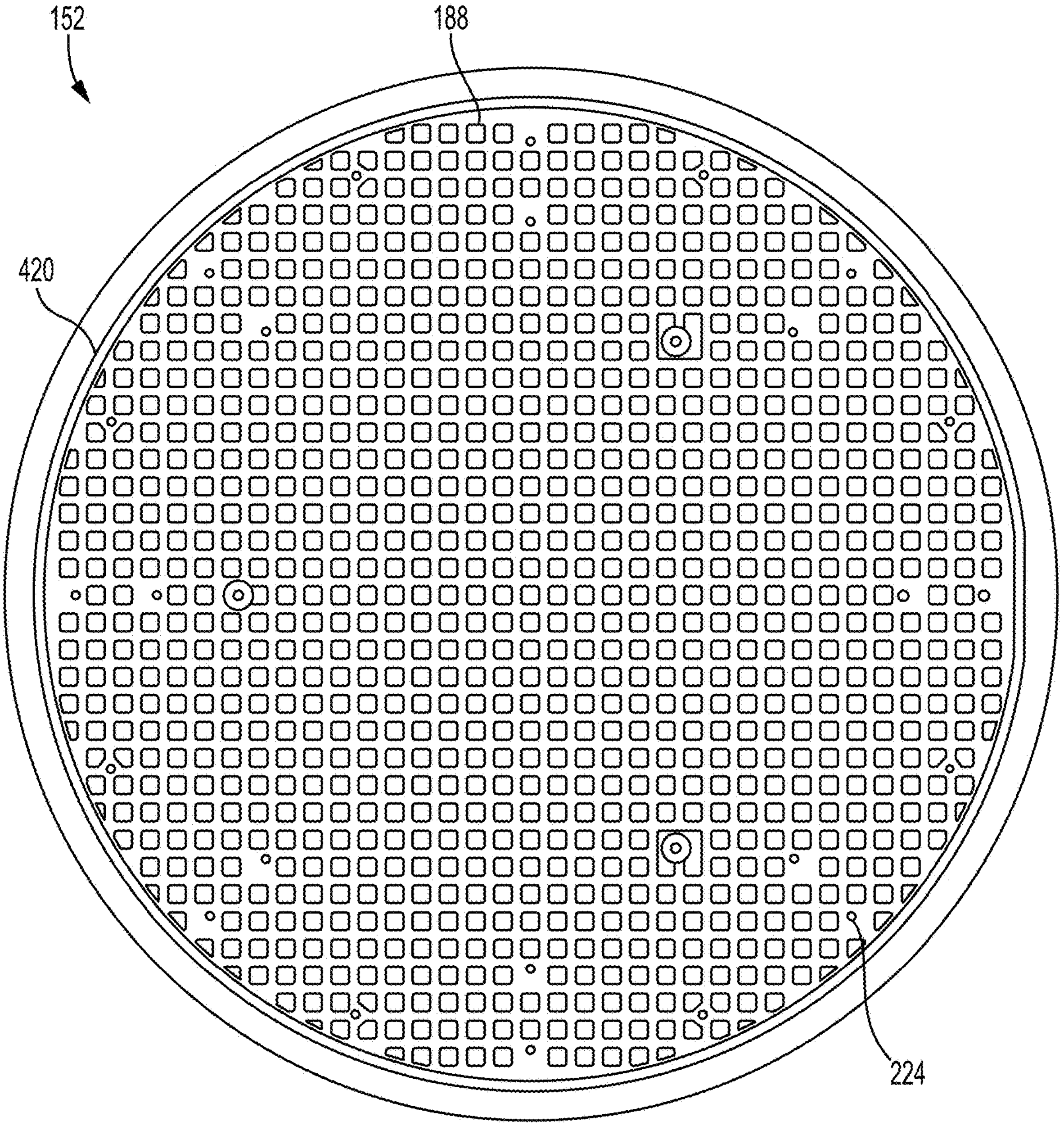
FIG. 8 depicts a top plan view of the electrostatic chuck of FIG. 7 in accordance with at least some embodiments of the present disclosure.

FIG. 7 depicts an isometric top view of an ESC 152 in accordance with at least some embodiments of the present disclosure. FIG. 8 depicts a top plan view of the ESC 152 of FIG. 7 in accordance with at least some embodiments of the present disclosure. In some embodiments, a total surface area of the substrate support surface defined by the plurality of mesas 188 is about 35 percent to about 40 percent of a total surface area of the top surface 202. In some embodiments, the plurality of first mesas 330 are about 0.18 inches to about 0.23 inches wide by about 0.18 inches to about 0.23 inches long.

Figure 9:
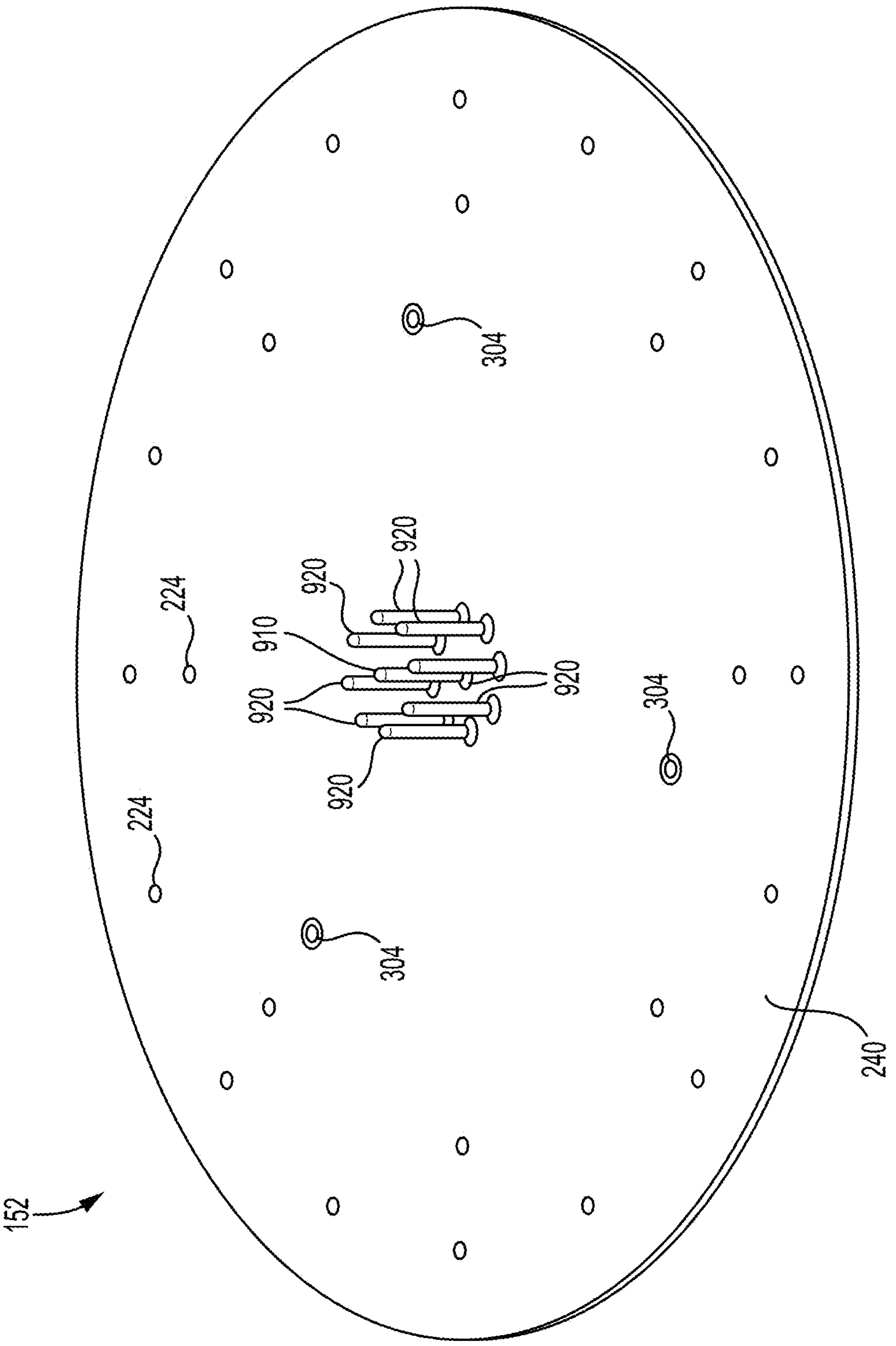
FIG. 9 depicts a bottom isometric view of the electrostatic chuck in accordance with at least some embodiments of the present disclosure.
Figure 10:
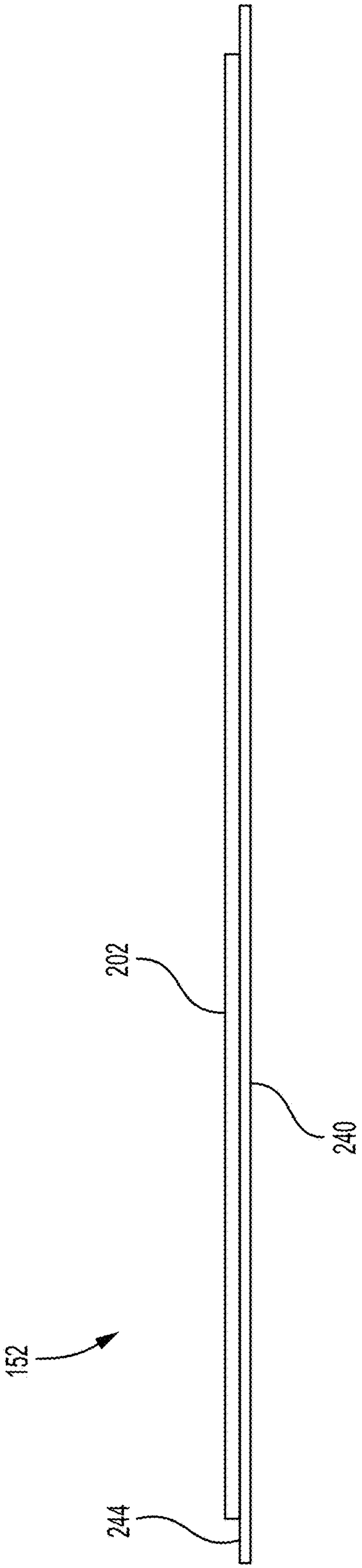
FIG. 10 depicts a side elevation view of the electrostatic chuck in accordance with at least some embodiments of the present disclosure.
Figure 11:
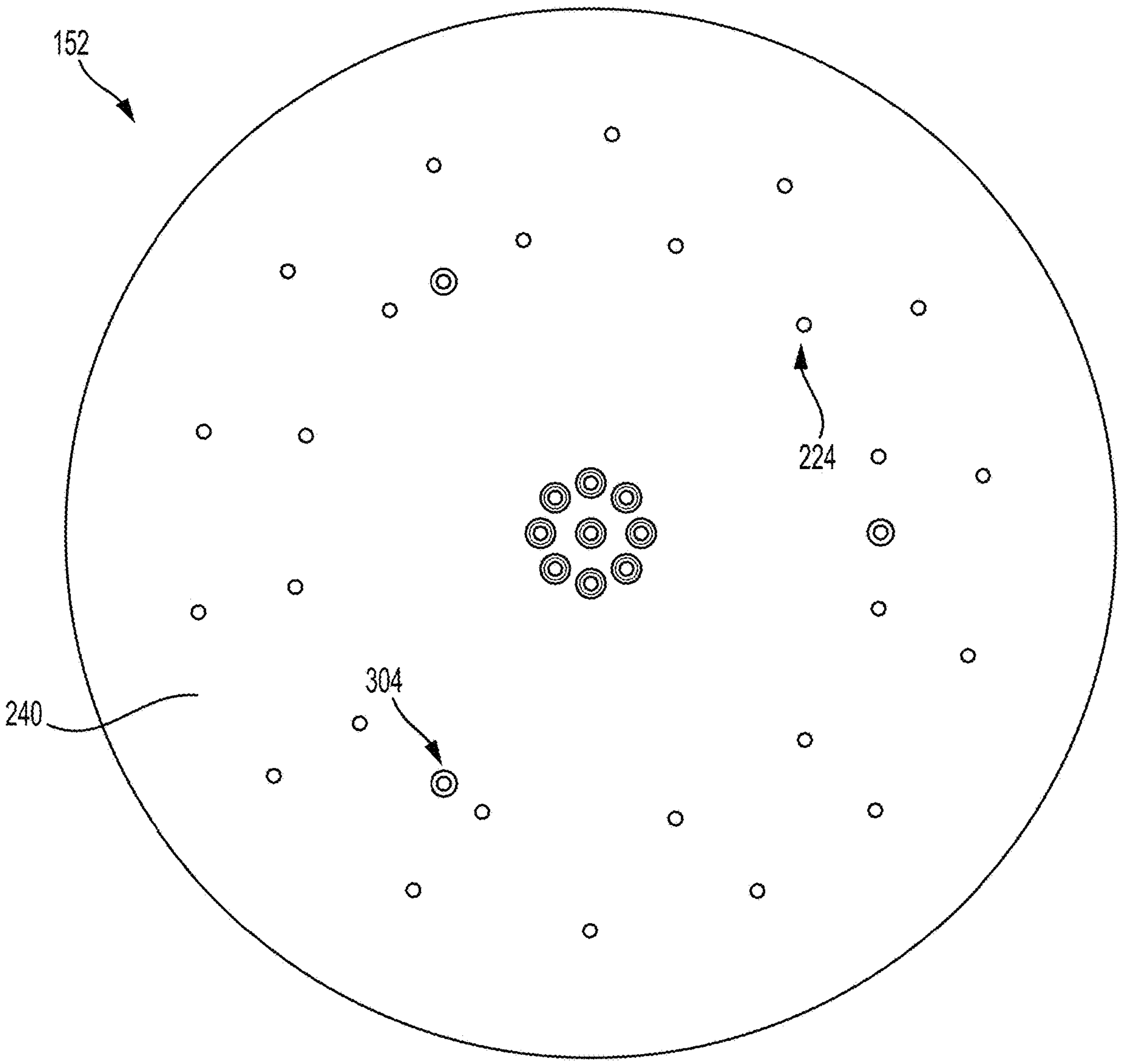
FIG. 11 depicts a bottom view of the electrostatic chuck in accordance with at least some embodiments of the present disclosure.

FIG. 9 depicts a bottom isometric view of an ESC 152 in accordance with at least some embodiments of the present disclosure. FIG. 10 depicts a side elevation view of an ESC 152 in accordance with at least some embodiments of the present disclosure. FIG. 11 depicts a bottom view of an ESC 152 in accordance with at least some embodiments of the present disclosure. One or more terminals may be coupled to the bottom surface 240 of the ESC 152. For example, the one or more terminals include one or more chucking terminals 910 coupled to the one or more chucking electrodes 154. In some embodiments, the one or more terminals include one or more heater terminals 920. In some embodiments, the one or more heater terminals 920 comprise two heater terminals for each heater zone of the ESC 152. As depicted in FIG. 9, the one or more heater terminals 920 comprise eight heater terminals.

While the foregoing is directed to embodiments of the present disclosure, other and further embodiments of the disclosure may be devised without departing from the basic scope thereof.

The invention claimed is:

1. A substrate support, comprising:

an electrostatic chuck (ESC) having a top surface and a plurality of mesas extending upward from the top surface, wherein an upper surface of the plurality of mesas define a substrate support surface, wherein a total surface area of the substrate support surface is about 18 to about 40 percent of a total surface area of the top surface of the ESC, wherein the plurality of mesas include a plurality of first mesas that are substantially square shaped when viewed from above and a plurality of second mesas that are not square shaped when viewed from above, and wherein the ESC includes a plurality of backside gas openings extending through the ESC; and one or more chucking electrodes disposed in the ESC.

2. The substrate support of claim 1, wherein the plurality of mesas are substantially arranged in an orthogonal grid such that the plurality of first mesas are positioned along intersecting rows and intersecting columns.

3. The substrate support of claim 1, wherein the plurality of second mesas are disposed adjacent a peripheral edge of the top surface of the ESC, adjacent the plurality of backside gas openings in the top surface, and adjacent lift pin openings disposed in the ESC.

4. The substrate support of claim 3, wherein the plurality of first mesas are about 0.1 inches to about 0.25 inches wide by about 0.1 inches to about 0.25 inches long.

5. The substrate support of claim 1, further comprising one or more heating elements disposed in the ESC between the one or more chucking electrodes and a bottom surface of the ESC.

6. The substrate support of claim 1, wherein the plurality of backside gas openings are disposed in the ESC along one or more annular rings and terminate at the top surface of the ESC.

7. The substrate support of claim 6, further comprising a porous plug disposed in each of the plurality of backside gas openings.

8. The substrate support of claim 1, further comprising a plurality of lift pin openings disposed in the ESC.

9. The substrate support of claim 8, wherein a first lift pin of the plurality of lift pin openings extends through a first mesa of the plurality of mesas.

10. A substrate support, comprising:

an electrostatic chuck (ESC) having a top surface and a plurality of mesas extending upward from the top surface, wherein an upper surface of the plurality of mesas define a substrate support surface, wherein a total surface area of the substrate support surface is 18 percent to about 40 percent of a total surface area of the top surface of the ESC, wherein the ESC includes a plurality of lift pin openings, and wherein the ESC includes a plurality of backside gas openings extending through the ESC and terminating on the top surface, wherein the plurality of mesas include a plurality of first mesas and a plurality of second mesas, wherein the plurality of first mesas have a different shape than the plurality of second mesas when viewed from above; and one or more chucking electrodes disposed in the ESC.

11. The substrate support of claim 10, further comprising one or more terminals coupled to a bottom surface of the ESC.

12. The substrate support of claim 10, wherein the ESC includes an upper peripheral notch disposed about the top surface.

13. The substrate support of claim 10, wherein the plurality of lift pin openings are disposed radially inward of the plurality of backside gas openings.

14. The substrate support of claim 10, wherein the plurality of mesas comprise a plurality of first mesas, a plurality of edge mesas proximate an outer edge of the ESC, a plurality of lift pin mesas proximate the plurality of lift pin openings, and wherein the plurality of lift pin mesas are larger in size than the plurality of first mesas and the plurality of edge mesas.

15. The substrate support of claim 14, wherein the plurality of edge mesas are non-rectangular quadrilaterals.

16. A process chamber, comprising:

a chamber body defining an interior volume therein; and a substrate support disposed in the interior volume, the substrate support comprising:

an electrostatic chuck (ESC) having a top surface and a plurality of mesas extending upward from the top surface, wherein an upper surface of the plurality of mesas define a substrate support surface, wherein a total surface area of the substrate support surface is 18 percent to about 40 percent of a total surface area of the top surface of the ESC, wherein the plurality of mesas include a plurality of first mesas that are substantially square shaped when viewed from above and a plurality of second mesas that are not square shaped when viewed from above, and wherein the ESC includes a plurality of backside gas openings extending through the ESC; and one or more chucking electrodes disposed in the ESC.

17. The process chamber of claim 16, further comprising an RF plasma power source coupled to a lid of the chamber body.

18. The process chamber of claim 16, further comprising a backside gas supply coupled to the plurality of backside gas openings.

19. The process chamber of claim 16, wherein the substrate support further comprises a base assembly coupled to the ESC and having one or more cooling channels disposed therein.

20. The process chamber of claim 16, further comprising a lift mechanism having a plurality of lift pins configured to extend through the ESC.

* * * * *